United States Patent
Wu et al.

(10) Patent No.: US 8,438,463 B2
(45) Date of Patent: May 7, 2013

(54) DECODING TAIL-BITING CONVOLUTIONAL CODES

(75) Inventors: Huan Wu, Ottawa (CA); Sean Bartholomew Simmons, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 219 days.

(21) Appl. No.: 12/963,377

(22) Filed: Dec. 8, 2010

(65) Prior Publication Data

US 2012/0151304 A1     Jun. 14, 2012

(51) Int. Cl.
*H03M 13/03*     (2006.01)

(52) U.S. Cl.
USPC ........................................... 714/786; 714/795

(58) Field of Classification Search ................... 714/786, 714/795
See application file for complete search history.

(56) References Cited

U.S. PATENT DOCUMENTS

| | | | | |
|---|---|---|---|---|
| 6,378,106 | B1 * | 4/2002 | Allpress et al. | 714/795 |
| 7,042,938 | B2 * | 5/2006 | Malkov et al. | 375/233 |
| 7,590,928 | B2 * | 9/2009 | Chiang | 714/795 |
| 7,640,478 | B2 * | 12/2009 | Hedayat et al. | 714/755 |
| 2003/0053535 | A1 * | 3/2003 | Malkov et al. | 375/233 |
| 2006/0242531 | A1 * | 10/2006 | Hedayat et al. | 714/755 |
| 2012/0151304 | A1 * | 6/2012 | Wu et al. | 714/786 |

OTHER PUBLICATIONS

3GPP TS 36.212 V8.7.0; 3rd Generation Partnership Project; Technical Specification Group Radio Access Network; Evolved Universal Terrestrial Radio Access (E-UTRA); Multiplexing and Channel Coding; Release 8; May 2009; 60 pgs.
Shao, Rose Y., et al; IEEE Transactions on Communications; "Two Decoding Algorithms for Tailbiting Codes"; Oct. 2003; 8 pgs.; vol. 51, No. 10.
Core Technologies; "Viterbi Algorithm for Decoding of Convolutional Codes"; http://www.1-core.com/library/comm/viterbi/; 7 pgs.
Sun, Yang, et al; "Convolutional Coding with Viterbi Decoding-Algorithm Design and Hardware Implementation"; ELEC-430 Project Report; 7 pgs.
"The Viterbi Algorithm"; EE 121: Digital Communications; Apr. 24, 2008; 6 pgs.
"Quantum Convolutional Code"; http://en.wikipedia.org/wiki/Quantum_convolutional_code; Dec. 27, 2009; 4 pgs.
"Convolutional Code"; http://en.wikipedia.org/wiki/Convolutional_code; Aug. 13, 2010; 6 pgs.
"Trellis Modulation"; http://en.wikipedia.org/wiki/Trellis_modulation; May 25, 2010; 3 pgs.

(Continued)

*Primary Examiner* — Yolanda L Wilson

(57) ABSTRACT

A user equipment (UE) comprising at least one component configured to decode a tail-biting convolution code (TBCC) by calculating a plurality of paths that correspond to a plurality of encoder starting states and trace back at least one of the calculated paths per at least one iteration until a trace-back convergence check (TCC) condition fails, wherein the TCC condition fails if a starting state of a first traced back path among the calculated paths is not equal to a starting state of a subsequent traced back path.

24 Claims, 7 Drawing Sheets

OTHER PUBLICATIONS

"Viterbi Algorithm"; http://en.wikipedia.org/wiki/Viterbi_algorithm; Sep. 10, 2010; 14 pgs.

Vinck Han, A.J.; "The Viterbi Algorithm"; Lecture Notes Data Communications; Oct. 1, 2009; 31 pgs.; Institute for Experimental Mathematics; Ellernstrasse 29, 452326 Essen Germany.

Extended European Search Report; European Application No. 10194159.9; Apr. 1, 2011; 11 pages.

Chen, Tsao-Tsen, et al.; "Reduced-Complexity Wrap-Around Viterbi Algorithms for Decoding Tail-Biting Convolutional Codes"; 6 pages.

Min, Zhang, et al.; "Research on an-based Decode of Tail-biting Convolutional Codes and Their Performance Analyses Used in LTE System"; 2009 International Forum on Information Technology and Applications; 2009 IEEE Computer Society; 2009; 4 pages.

Cox, Richard V., et al.; "An Efficient Adaptive Circular Viterbi Algorithm for Decoding Generalized Tailbiting Convolutional Codes"; 8105 IEEE Transactions on Vehicular Technology; Feb. 1994; 12 pages; vol. 43, No. 1; New York, US.

\* cited by examiner

DECODING TAIL-BITING CONVOLUTIONAL CODES

BACKGROUND

As used herein, the terms "user equipment" and "UE" might in some cases refer to mobile devices such as mobile telephones, mobile devices, personal digital assistants, handheld or laptop computers, and similar devices that have telecommunications capabilities. Such a UE might consist of a UE and its associated removable memory module, such as but not limited to a Universal Integrated Circuit Card (UICC) that includes a Subscriber Identity Module (SIM) application, a Universal Subscriber Identity Module (USIM) application, or a Removable User Identity Module (R-UIM) application. Alternatively, such a UE might consist of the device itself without such a module. In other cases, the term "UE" might refer to devices that have similar capabilities but that are not transportable, such as desktop computers, set-top boxes, or network appliances. The term "UE" can also refer to any hardware or software component that can terminate a communications session for a user. Also, the terms "user equipment," "UE," "user agent," "UA," "user device" and "user node" might be used synonymously herein.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
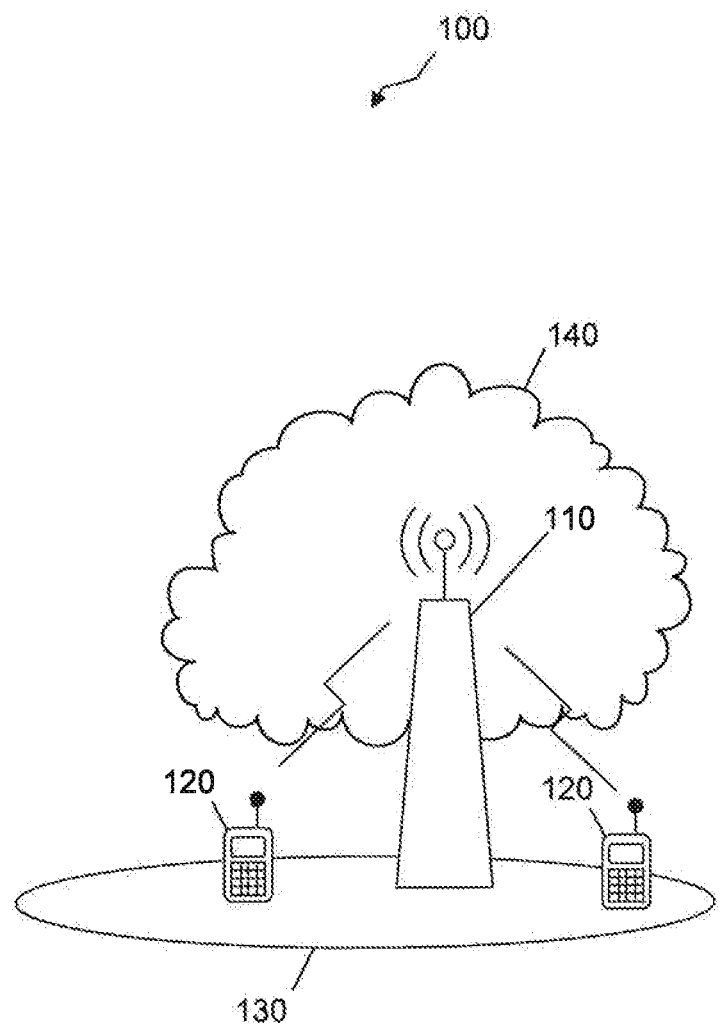
FIG. 1 is a schematic diagram of a communications system that allows a UE to communicate with other network components and/or devices according to an embodiment of the disclosure.

It should be understood at the outset that although illustrative implementations of one or more embodiments of the present disclosure are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

TBCCs are used in forward error correction (FEC) schemes for control channels, such as a Physical Control Channel (PDCCH), in many wireless communications systems. For example, the TBCCs may be used in the Third Generation Partnership Project (3GPP) standard, including Global System for Mobile Communications (GSM), General packet radio service (GPRS), IS-54, Enhanced Data rates for GSM Evolution (EDGE), worldwide interoperability for microwave access (WiMAX), and long-term evolution (LTE) mobile communications systems. In convolutional coding, an encoder receives a stream of x bits and maps them into an output stream of y bits by operating on one or multiple bits at a time (x and y are integers). The encoder uses each received bit and a number of z bits retained in "memory", also referred to as a "state", to output bits and to update the state in memory for processing the next received bit. The efficiency or data rate of a convolutional code is measured by the ratio of the quantity of bits in the input stream, x, to the quantity of bits in the output stream, y. The ratio x/y is referred to as the coding rate and the state bit size z is referred to as the constraint length. Typically, the values of x, y, and z may range from 1 to 2, 2 to 3, and 4 to 7, respectively.

The output stream may then be received and used at a decoder to retrieve the original input stream or a close match to the input stream to the encoder. The transitions or path between the states of the encoder may be tracked using the output stream in a graphical representation referred to as a trellis. If a path in the trellis corresponds to a TBCC, then its beginning state is equal to its ending state. The decoder may use a TBCC decoding algorithm to retrieve a match to the original input stream that corresponds to the most likelihood path (MLP) in the trellis. Many algorithms have been proposed for decoding a TBCC that include using Viterbi algorithms (VAs), such as a wrap-around Viterbi algorithm (WAVA) that provides a near-maximum likelihood (ML) match to the input stream with relatively low complexity. The TBCC may be decoded by implementing a plurality of iterations or Viterbi trials in an attempt to find a ML tail-biting path (MLTBP) in the trellis. The WAVA and other decoding algorithms may use different early termination conditions, limited number of iterations, or both to reduce the amount of time/memory needed to decode the TBCCs.

Disclosed herein is a system and method for decoding TBCCs in received bit streams, such as in control/data channels in radio access network (RANs). In some embodiments, the proposed TBCC decoding method or algorithm may have improved efficiency, for example in comparison to other TBCC decoding algorithms. In some embodiments, the efficiency may be improved using an early termination condition that reduces the iterations and/or the steps per iteration and hence reduce the time/memory needed for decoding, e.g. in comparison to the WAVA. The TBCC decoding scheme may also provide an input stream at the decoder that is sufficiently close to the original input stream at the encoder and have comparable accuracy with respect to other TBCC decoding algorithms.

FIG. 1 illustrates an embodiment of a RAN 100, which may be a LTE or LTE-Advanced (LTE-A), as described in 3GPP, or other well known or after developed networks. In this example, an LTE or LTE-A system might include an Evolved Universal Terrestrial Radio Access Network (E-UTRAN) node B (or eNB), a wireless access point, or a similar component rather than a traditional base station. FIG. 1 is exemplary and may have other components or arrangements in other embodiments. In an embodiment, the RAN 100 may comprise at least one access device 110 and at least one UE 120, which may be both located within a cell 130.

As used herein, the term "access device" refers to any component of the wireless network, such as a traditional base station, a wireless access point, or an LTE or LTE-A node B or eNB, that creates a geographical area of reception and transmission coverage allowing a UE 120 or a relay node (not shown) to access or communicate with other components in a telecommunications system, such as second UE 120. In this document, the term "access node" and "access device" may be used interchangeably, but it is understood that an access node may comprise a plurality of hardware and software components.

The access device 110 may communicate with any UE 120 within the same cell 130, directly via a direct link, such as in a UTRAN. The cell 130 may be a geographical area of reception and transmission coverage. For instance, the direct link may be a point-to-point link established between the access device 110 and the UE 120 and used to transmit and receive signals between the two. Alternatively, the access devices 110 may communicate with any UE 120 in the same cell 130 over shared links, such as in an E-UTRAN. For instance, the shared links may comprise an uplink shared channel and a downlink shared channel. Additionally, the access devices 110 may communicate with other components or devices to provide for the components of the RAN 100 access to any other network 140, for instance using similar or different network protocols or technologies. In an embodiment, the UEs 120 may move about between different cells 130 and their communications may be handed-over between the different cells 130, where the UEs 120 may communicate with different access devices 110.

In some embodiments, the UEs 120 may communicate via a combination of wireless and wired networks. The networks may include the RAN 100, a Wireless LAN (WLAN) network, an Ethernet based network, an Internet Protocol (IP) based network, a Digital Subscriber Line (DSL) network, an Optical communications network, and/or any other wireless and wired networks that may be used to exchange communications between the UEs 120. The communications between the UEs 120 may comprise voice and/or video calls, emails, text/media messages (e.g. using SMS or Multimedia Messaging Service (MMS)), and/or any other data or message exchanges.

The communications between the access devices 110 and the UEs 120 may comprise a plurality of control and/or data channels, which may include a PDCCH, a physical downlink dedicated channel (PDDCH), an uplink dedicated channel (PUDCH), a physical uplink control channel (PUCCH), or combinations thereof. Any of the channels may be used to carry bit streams between the access device(s) 110 and the UE(s) 120. The bit streams may comprise a plurality of encoded bits, such as FEC codes, The bit streams or FEC codes may comprise TBCCs that correspond to input streams encoded at a transmitter, for example in a base station 110. The TBCCs may then be received in a receiver, for example in a UE 120, and decoded to retrieve the original input stream with acceptable amount of errors. In another embodiment, the TBCCs may be encoded at the UE 120 and decoded at the base station 110.

In an embodiment, the UE 120 or the access device 110 may comprise a receiver/decoder that is configured to implement a TBCC decoding algorithm to decode a TBCC in a received output stream from a transmitter/encoder. The TBCC decoding algorithm may implement a plurality of iterations or Viterbi trials to compute a plurality of paths (or sub-trellises), e.g. in a trellis, and find a ML tail-biting path (MLTBP) or a ML path from the computed paths that best matches the encoding states of the transmitter/encoder. The paths may be computed using the received TBCC bits. The paths computed during each iteration correspond to all the possible starting states used at the transmitter/encoder. The states of each computed path may be examined in turn using a trace-back procedure from the path ending state to its starting state, until all the computed paths are examined or an early termination condition is met.

The trace-backs and iterations may be ended when a MLTBP or a ML path is selected. The states in the MLTBP or the ML path may then be used to reconstruct or estimate with sufficient accuracy the original input stream at the transmitter/encoder (before encoding). The early termination condition may be based on a trace-back convergence check (TCC), where each of the computed paths in an iteration may be checked, in some order, to determine if the trace-backs may be terminated early before examining all the computed paths, as described in detail below. As such, this TBCC decoding algorithm may implement fewer trace-backs and/or iterations than other TBCC decoding algorithms, such as the WAVA. The proposed TBCC decoding algorithm may also estimate the original input stream at about the same accuracy as other TBCC algorithms. Reducing the number of trace-backs and/or iterations in the algorithm may reduce the amount of memory and/or time needed to decode the TBCCs and also reduce the complexity of implementation.

Figure 2:
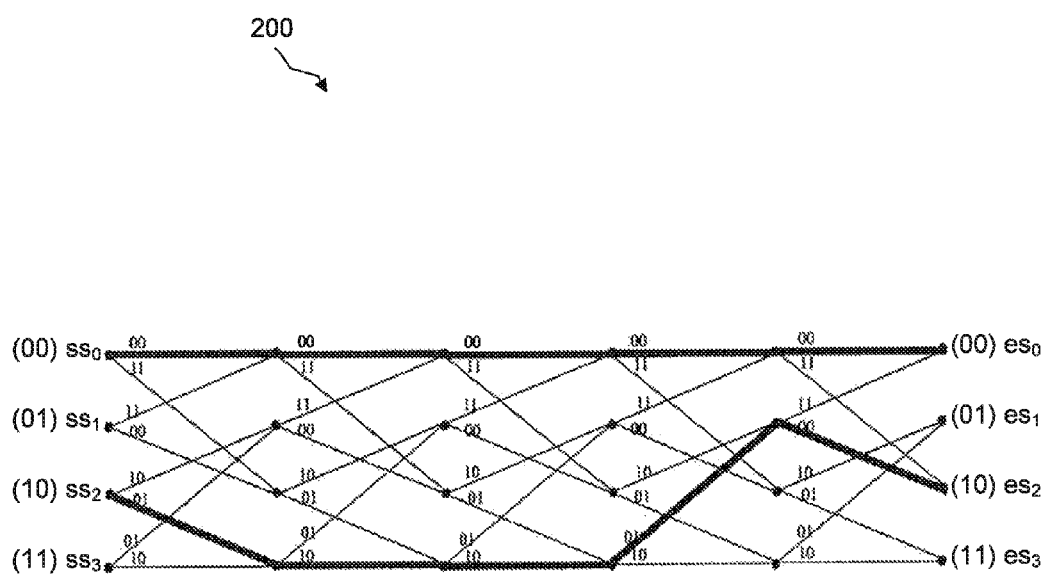
FIG. 2 illustrates a graphical representation of computed paths to decode tail-biting convolution codes (TBCCs) according to an embodiment of the disclosure.

FIG. 2 illustrates an example of a trellis 200 that may comprise a plurality of computed paths corresponding to the different possible starting of an encoder. The trellis 200 is a graphical representation of the path computation process and may or may not be actually or explicitly used in the implementation of the TBCC decoding algorithm. For instance, instead of using the graphical representation of the trellis, the paths may be computed and trace-backed by storing the values/parameters associated with the paths in the UE's memory or data storage medium.

The trellis 200 may comprise M starting states and equally M ending states. For example, there may be four starting states (M=4) that include, $ss_0=00$, $ss_1=01$, $ss_2=10$, and $ss_3=11$, and similarly four ending states that include, $es_0=00$, $es_1=01$, $es_2=10$, and $es_3=11$. During the TBCC decoding algorithm, one path may be computed for each starting state from a plurality of possible paths that may be found in the trellis. For example, the computed path for each starting state may have the highest value state metric among the possible paths. As such, the trellis may comprise M computed paths (or subtrellises) in the trellis. In FIG. 2, the bold line paths represent two of the computed paths from a plurality of possible paths. The two computed paths are tail-biting paths that link the starting states $ss_0$ and $ss_3$ to their equal ending states $es_0$ and $es_3$, respectively.

The paths for each starting state may be computed or updated at each iteration using a VA. As such, the number of implemented VAs may be equal to the number of iterations. Further, each VA that is used to compute or update the M paths may implement N Viterbi updates (or decoding stages) to transition between each two states in the computed paths. The number of transitions between the states may be proportional to the number of bits in the received TBCC at the receiver/decoder and reflects the states used in the transmitter/encoder. For example, as shown in FIG. 2, there may be five state transitions or sections in each path between its starting and ending states, which may correspond to five bits in the TBCC. The complexity of the TBCC encoding algorithm may be proportional to the number of iterations (I), the number of states in VA per iteration (M), the number of trace-backs per iteration (T), and the number of Viterbi updates (N) per iteration, e.g. I×(M×N+T×N). Thus, the complexity and the amount of time/memory needed for the TBCC decoding algorithm may increase as the number of possible iterations, trace-backs, starting states and/or the quantity of bits in the TBCC increase. For this reason, reducing the number of trace-backs and/or iterations, by using an early termination condition, becomes more critical for longer TBCCs that are based on more states in the transmitter/encoder.

Specifically, the TBCC decoding algorithm may use a TCC early termination condition to reduce the number of trace-backs and/or iterations. After an iteration, the M updated paths (for the M starting states) may be sorted in a descending order of their calculated state metric values. For instance, using correlation as metrics in a VA, the M updated paths may be ordered from the updated path that has the highest value state metric to the updated path that has the lowest value state metric. The highest value state metric may indicate that the corresponding updated path is a ML match to the actual states used in the transmitter/encoder. A path trace-back may then be used to examine the state transitions of the first updated path, e.g. in the order from the ending state to the starting state. If the first updated path is a tail-biting path, i.e. has the same or equal starting and ending states, then the first updated path may be the MLTBP. In this case, the remaining updated paths may be ignored and no further trace-backs and iterations are performed. The first updated path may be used to retrieve the original bits of the input stream before encoding.

If the first updated path is not a tail-biting path, then each next updated path with the next highest value state metric may be traced back in turn, until an updated tail-biting path is found or a TCC condition fails. The TCC condition fails if the starting state of the next updated path is not equal to the starting state of the first updated path. The TCC condition may be checked in the iterations that succeed the first iteration. As such, if a tail-biting path is found before examining all the remaining paths, then the remaining computed paths may be ignored and no further trace-backs and iterations are performed. The tail-biting path may then be used to retrieve the bits of the input stream. Alternatively, if the TCC condition fails before examining all the remaining paths, then the remaining updated paths may be ignored and no further trace-backs and iterations are performed. The starting states of all the updated paths may then be replaced with the corresponding ending states of the updated paths and the TBCC decoding algorithm may proceed to the next iteration, where the M paths may be again updated and reexamined for early termination in the same manner above.

In other embodiments, the computed paths may be ordered and processed for early termination in any other order than described above. For instance, using Euclidean distance as the metrics in a VA, the computed paths may be ordered in an ascending order of their calculated state metric values, where the lowest value state metric value may indicate that the corresponding computed path is a ML match to the actual states used in the transmitter/encoder.

The TBCC decoding algorithm that uses a TCC early termination condition similar to that described above may be referred to herein as a WAVA-TCC. The WAVA-TCC may comprise at least some of the following instructions or similar instructions:

1) Start with the VA with all state metrics set to zero (equal likelihood). Set the iteration index i=0.
2) At the end of a VA iteration, i=i+1; sort the ending state metrics in descending order. Do one trace-back from the ending state ($es_0$) of the top state metrics to find the starting state ($ss_0$). If $ss_0$==$es_0$ (i.e., it is the ML tail-biting path), go to step 5). Otherwise continue to next step.
3) If i>1, continue the trace-backs from the ending states ($es_k$) following those of the top state metrics to find the starting state ($ss_k$), k=1, 2, ... M-1, M is the number of states of the trellis. If $ss_k$~=$ss_0$ and i<Imax (TCC fails), then stop trace-back and go to step 4). Otherwise continue trace-back until a tail-biting path is found ($ss_k$==$es_k$) or all the trace-backs are exhausted. If a tail-biting path is found, go to step 5). Otherwise continue to next step.
4) If i<Imax, update the starting state metrics with the corresponding ending state metrics (wrap-around) and go to step 2). Otherwise continue to next step.
5) Output the decoded bits from a tail-biting path if there is one. Otherwise output the decoded bits from the ML path, i.e., the path with the maximum ending state metrics.

Figure 3:
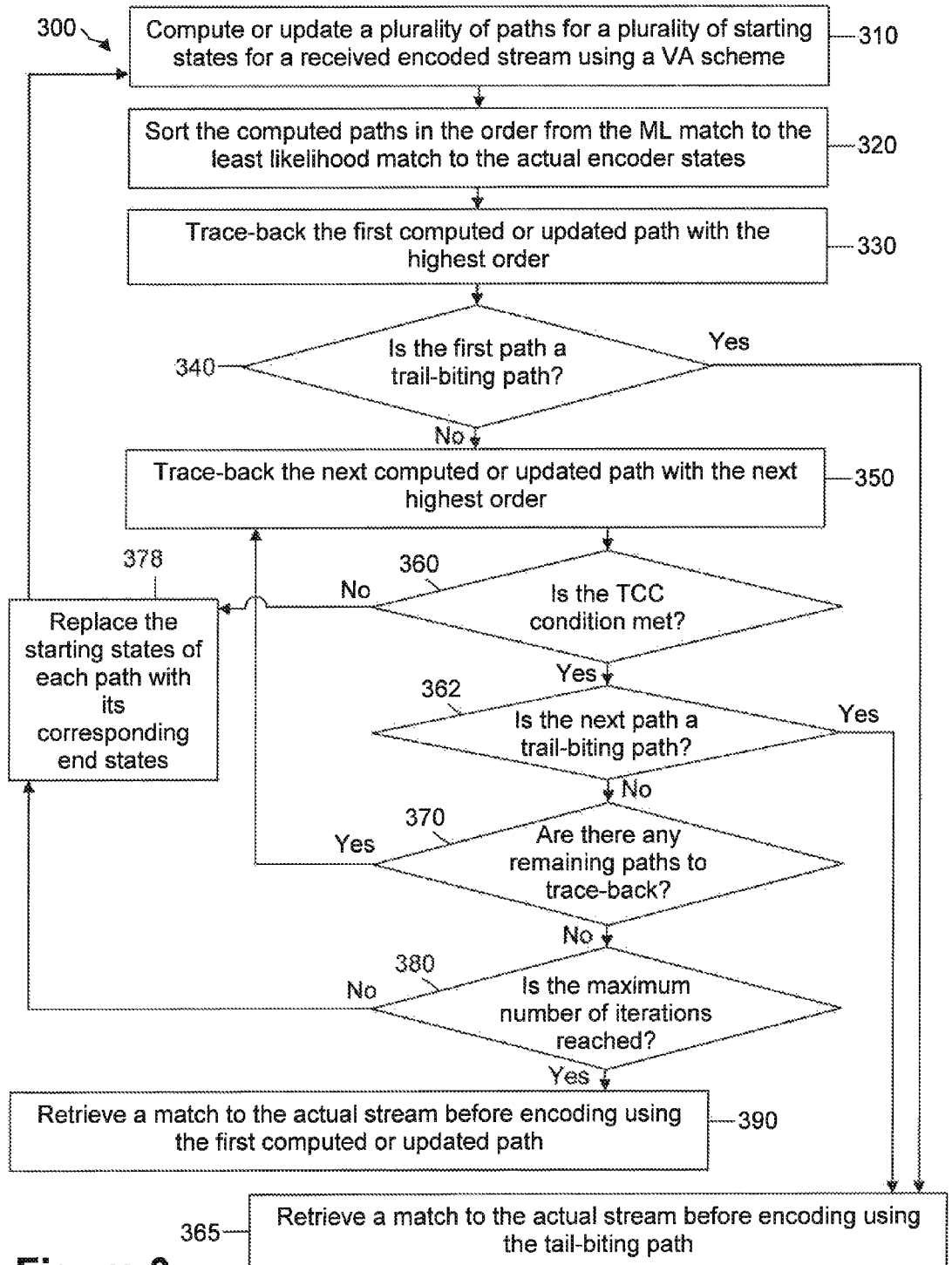
FIG. 3 is a flowchart of a method for decoding TBCCs according to an embodiment of the disclosure.

FIG. 3 illustrates an embodiment of a method 300 for decoding TBCCs in the RAN 100. For instance, the method 300 may be implemented by a UE 120 or a processor at the UE 120 to decode a TBCC in a PDCCH. The method 300 may use the TCC condition to early terminate trace-backs per iteration and may correspond to the WAVA-TCC described above. At block 310, a plurality of paths for a plurality of starting states may be computed or updated for a received encoded stream using a VA scheme. For example, the UE 120 may use a VA scheme to process the received TBCC in a bit stream in the PDCCH and thus obtain a plurality of computed paths that correspond to all the possible starting states used at the transmitter/encoder. The UE 120 may implement a VA to compute each of the paths that have a different starting state in a first or initial iteration of the TBCC decoding algorithm or to update each of the paths in a subsequent iteration.

At block 320, the computed paths may be sorted in the order from the ML match to the least likelihood match to the actual encoder states. For example, when correlation metrics is used in a VA, the UE 120 may sort the computed paths in the order from the path that has the highest value state metric to the path with the lowest value state metric, where the highest value state metric indicates the ML matched path. Alternatively, when Euclidean distance metrics is used in a VA, the UE 120 may sort the computed paths in the order from the path that has the lowest value state metric to the path with the highest value state metric, where the lowest value state metric indicates the ML matched path.

At block 330, the first computed or updated path with the highest order may be traced back. The UE 120 may trace-back the first computed or updated path to examine the ending and starting states of the path. At block 340, the method 300 may determine whether the first path is a trail-biting path. The first path may be a tail-biting path if its starting and ending states are the same or equal. If the condition in block 340 is satisfied, the method 300 may proceed to block 365. Otherwise, the method 300 may proceed to block 350.

At block 350, the next computed or updated path with the next highest order may be traced back. The UE 120 may trace-back the next highest order computed or updated path that has the next highest value state metric to examine the ending and starting states of the path. At block 360, the method 300 may determine whether the TCC condition is met, i.e. whether the starting state of the next computed or updated path is equal to the starting state of the first computed or updated path. If the TCC condition is met, the method 300 may proceed to block 362. Otherwise, the method 300 may proceed to block 382. In an embodiment, the TCC condition may not be checked during the first iteration of the TBCC decoding algorithm to allow only one trace-back of the first ML path during the first iteration. At block 362, the method 300 may determine whether the next path, which satisfies the TCC condition, is a trail-biting path. If the condition in block 362 is met, then the method 300 may proceed to block 365. Otherwise, the method 300 may proceed to block 370.

At block 365, a match to the original bit stream before encoding may be retrieved using the tail-biting path, i.e. the MLTBP path. The tail-biting path may be the first computed or updated path or any of the next computed or updated paths that satisfies the TCC condition. The UE 120 may use the transitions between the states of the MLTBP to reconstruct a ML match to the TBCC in the original bit stream before encoding.

Alternatively, at block 370, the method 300 may determine whether there are any remaining paths to trace-back. The method 300 may return to block 350 if there are any remaining paths to trace-back. If all the computed or updated paths are already traced back and the TCC condition is not satisfied, the method 300 may proceed to block 380. At block 380, the method 300 may determine if the maximum number of iterations is reached. The maximum number of iterations may be set before implementation to restrict the memory/time usage of the UE 120. The maximum number of iterations may also be adjusted based on the channel and/or encoding conditions. If the condition in block 380 is not met, the method 300 may proceed to block 382. Otherwise, the method 300 may proceed to block 390.

At block 382, the starting states of each path may be replaced with its corresponding ending state. The method 300 may then return to block 310 to update the paths and subsequently trace-back the paths to find a tail-biting path, as described above. Alternatively, at block 390, a match to the original bit stream before encoding may be retrieved using the first computed or updated path. At this point, the first computed or updated path may not be a tail-biting path but may be the ML path with the highest order and therefore the ML match to the actual encoder states. The UE 120 may use the transitions between the states of the ML path to reconstruct a ML match to the original bit stream before encoding.

Figure 4:
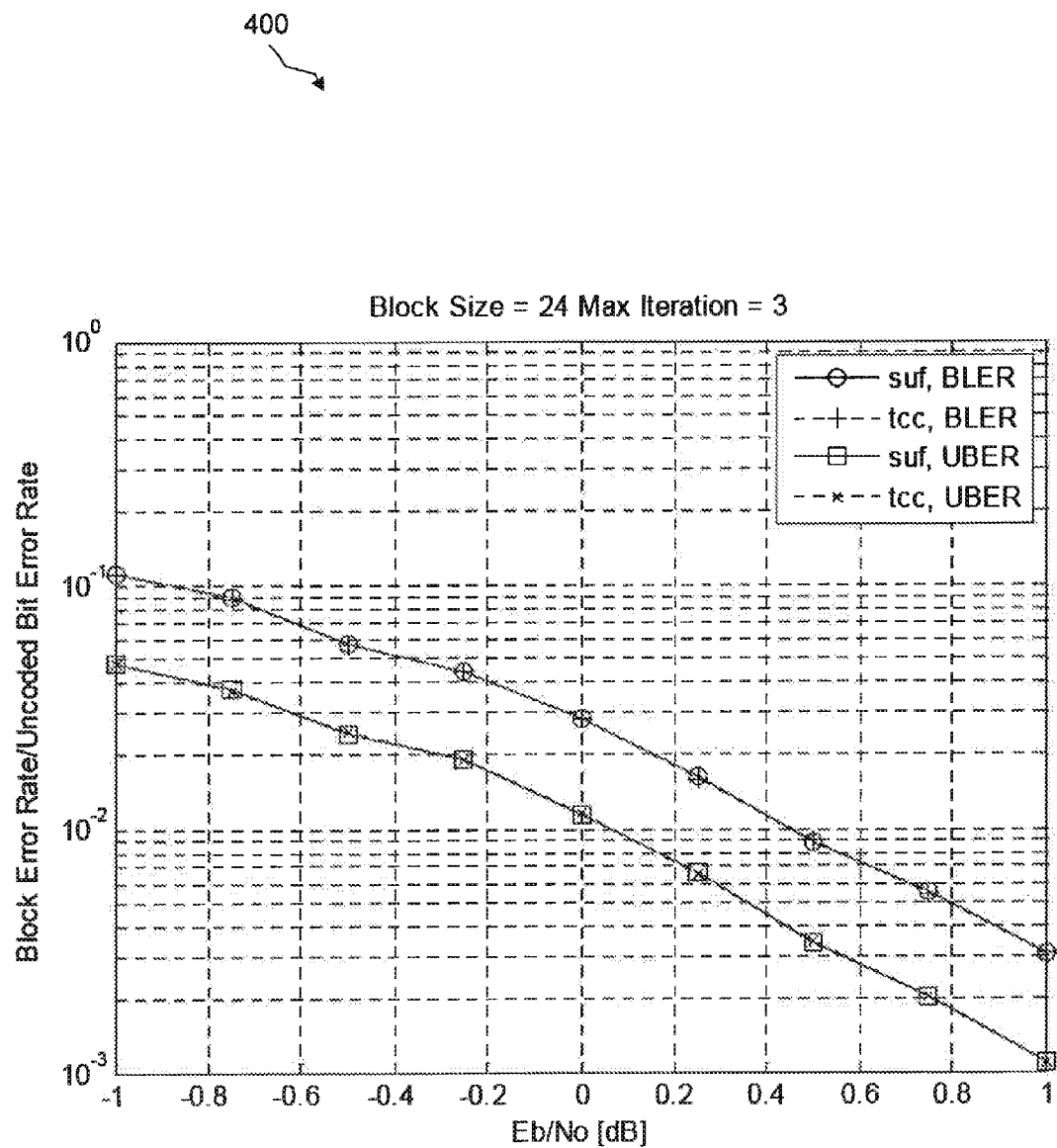
FIG. 4 illustrates an example chart for block error rates and uncoded bit error rates achieved using a TBCC decoding algorithm according to an embodiment of the disclosure.

FIG. 4 illustrates a chart that shows an example of block error rates and uncoded bit error rates achieved using the WAVA-TCC and using a WAVA that implements a sufficient termination condition to terminate early the decoding scheme. To distinguish the two decoding algorithms, the WAVA is referred to herein as the WAVA-SUF (WAVA with sufficient termination condition). The WAVA-SUF scheme is described in detail in a publication by Rose Y. Shao, et al., entitled "Two Decoding Algorithms for Tailbiting Codes", in the Institute of Electrical and Electronics Engineers (IEEE) Transactions on Communications, Vol. 51, No. 10, October 2003, pp. 1658-1665, which is incorporated herein by reference as if reproduced in its entirety. The WAVA-SUF may use an early termination condition to reduce the number of iterations that is different than the TCC condition described herein and that does not reduce or limit the trace-backs per iteration.

The rates shown are obtained using simulations for a plurality of TBCCs defined in 3GPP LTE. The TBCCs were generated using a constraint length z=7, a coding rate x/y=1/3, and the generator polynomials $G_0=133_O$, $G_1=171_O$, and $G_0=165_O$. The results are shown for a data block size equal to 24 blocks, which corresponds to one possible downlink control information format. The data corresponds to a signal that is modulated using Binary phase-shift keying (BPSK) at the transmitter and contaminated by additive white Gaussian noise (AWGN) at the receiver.

The resulting block error rates and uncoded bit error rates at the receiver are plotted in the figure vs. a range of signal-to-noise ratio (SNR) values in decibel (dB). In FIG. 4, the block error rates are labeled BLER, the uncoded bit error rates are labeled UBER, and the SNR values are labeled Eb/No and range from −1 to 1. Each point (i.e. BLER or UBER value) in the figure is obtained using at least 300 block errors. As shown, the BLER values and similarly the UBER values obtained using both WAVA-SUF and WAVA-TCC substantially overlap. The overlap in the BLER values and the UBER values between the two decoding algorithms shows that the WAVA-TCC may have about the same or comparable accuracy of the WAVE-SUF in detecting and decoding the TBCCs.

Additionally, Table 1 below lists the average number of iterations and the average number of trace-backs per iteration for both the WAVA-TCC and WAVA-SUF algorithms to decode the TBCCs. Specifically, the average number of iterations and the average number of trace-backs per iteration are shown for three points in FIG. 4, at Eb/No=−1, Eb/No=0, and Eb/No=1. Table 1 shows that the WAVA-TCC may implement about 6 to 7 times less trace-backs per iteration than the WAVA-SUF, for all three points shown. The number of iterations in the case of the WAVA-TCC may also be less than the number of iterations in the WAVA-SUF for all three points.

TABLE 1

Comparison of average iterations and trace-backs per iteration for block size = 24.

| | block size = 24 | | | |
|---|---|---|---|---|
| | average iterations | | average trace-backs per iteration | |
| Eb/No (dB) | SUF | TCC | SUF | TCC |
| −1.0 | 1.69 | 1.60 | 19.24 | 3.20 |
| 0 | 1.38 | 1.32 | 12.47 | 1.67 |
| 1.0 | 1.17 | 1.15 | 6.71 | 1.15 |

Figure 5:
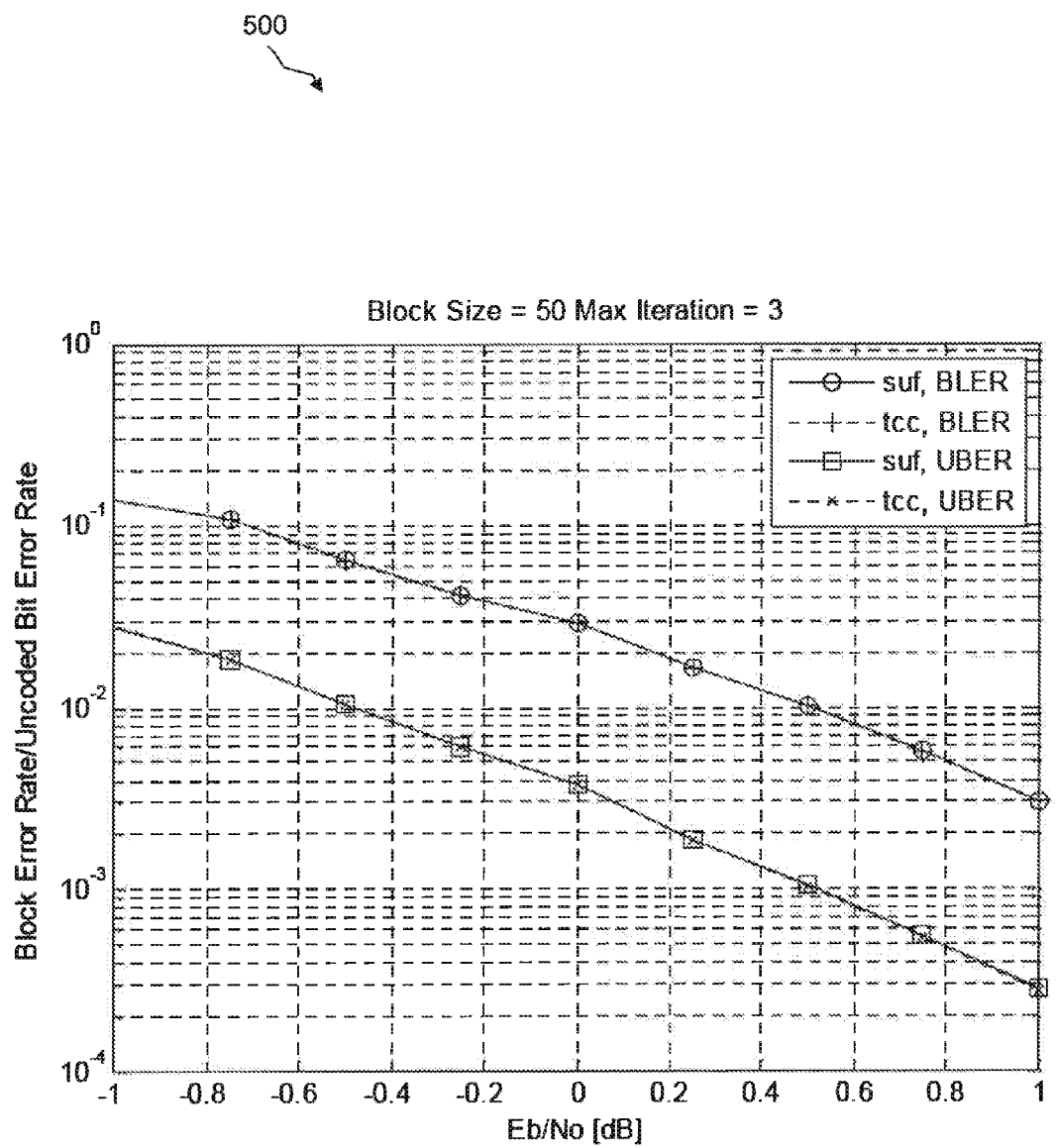
FIG. 5 illustrates another example chart for block error rates and uncoded bit error rates achieved using a TBCC decoding algorithm according to an embodiment of the disclosure.
Figure 6:
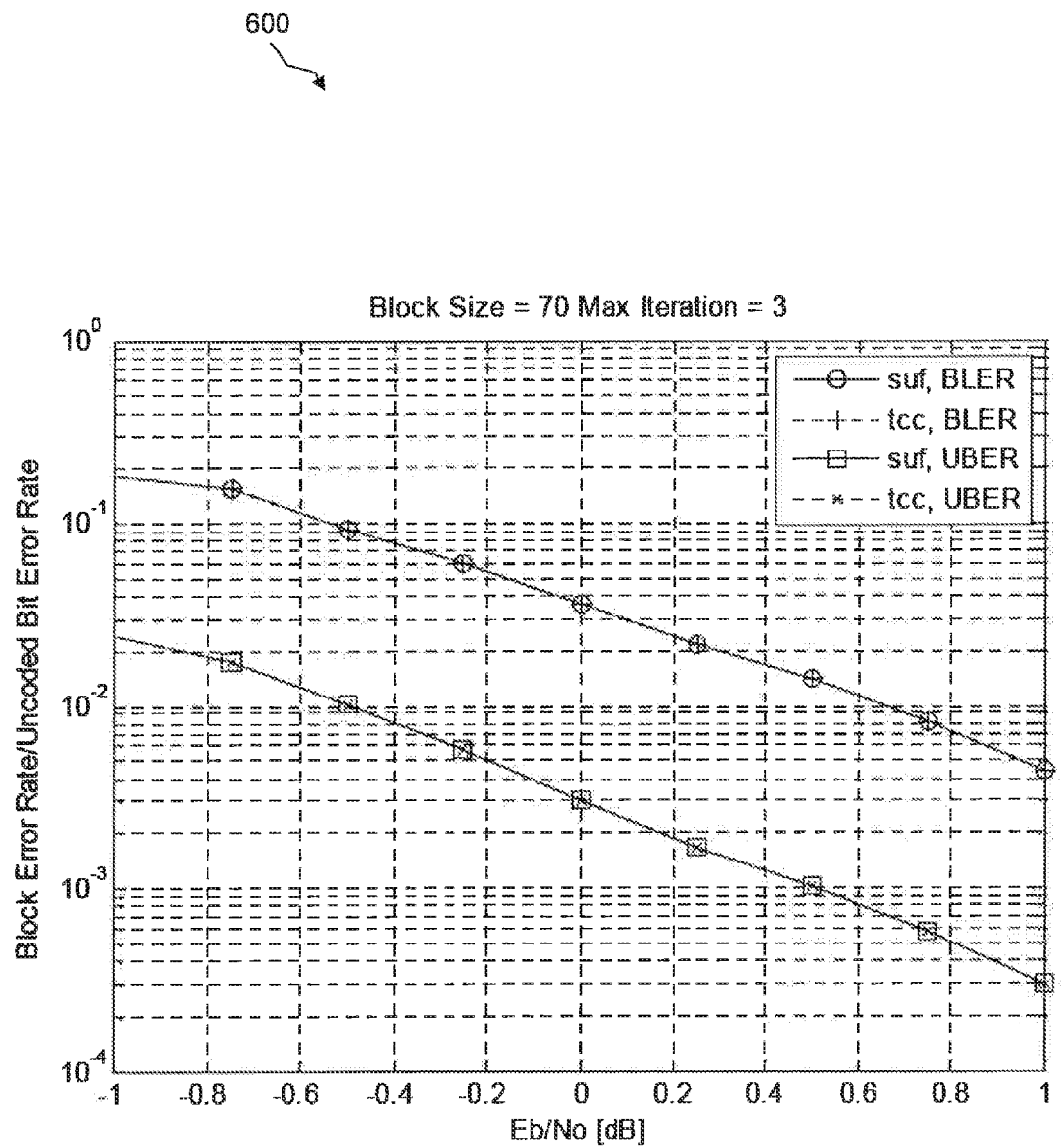
FIG. 6 illustrates another example chart for block error rates and uncoded bit error rates achieved using a TBCC decoding algorithm according to an embodiment of the disclosure.

Similarly, FIG. 5 and FIG. 6 illustrate two additional charts that show two more examples of block error rates and uncoded bit error rates achieved using the WAVA-TCC and the WAVA-SUF. The results shown in FIG. 5 and FIG. 6 are obtained using the same transmission conditions described above with the difference that the data block sizes in FIG. 5 and FIG. 6 are equal to 50 bits and 70 bits, respectively. As in the case of FIG. 4, both BLER values and the UBER values obtained using WAVA-SUF and WAVA-TCC substantially overlap, which indicates that the WAVA-TCC may have about the same or comparable accuracy of the WAVE-SUF regardless of at least block sizes up to 70 bits. Such quantity of block sizes may represent relatively short codes or TBCCs, but may be suitable for control channel data, such as the PDCCH.

Table 2 and Table 3 below also list the average number of iterations and the average number of trace-backs per iteration for both the WAVA-TCC and WAVA-SUF algorithms for the data in FIG. 5 and FIG. 6, respectively. Similar to Table 1, Table 2 and Table 3 also show that the WAVA-TCC may implement less trace-backs per iteration and less iterations than the WAVA-SUF for the data block sizes 50 and 70, respectively. Although, the results above are shown for data block sizes up to about 70 bits, the WAVA-TCC may still provide comparable accuracy to the WAVA-SUF, and similar decoding algorithms, for any relatively short or large TBCCs with less trace-backs per iteration and/or less iterations during the decoding process.

TABLE 2

Comparison of average iterations and trace-backs per iteration for block size = 50.

| Eb/No (dB) | block size = 24 | | | |
| --- | --- | --- | --- | --- |
| | average iterations | | average trace-backs per iteration | |
| | SUF | TCC | SUF | TCC |
| −1.0 | 1.68 | 1.52 | 19.04 | 2.20 |
| 0 | 1.36 | 1.29 | 11.99 | 1.36 |
| 1.0 | 1.17 | 1.14 | 6.84 | 1.11 |

TABLE 3

Comparison of average iterations and trace-backs per iteration for block size = 70.

| Eb/No (dB) | block size = 24 | | | |
| --- | --- | --- | --- | --- |
| | average iterations | | average trace-backs per iteration | |
| | SUF | TCC | SUF | TCC |
| −1.0 | 1.67 | 1.50 | 18.26 | 1.89 |
| 0 | 1.37 | 1.29 | 11.88 | 1.32 |
| 1.0 | 1.17 | 1.14 | 6.77 | 1.11 |

Figure 7:
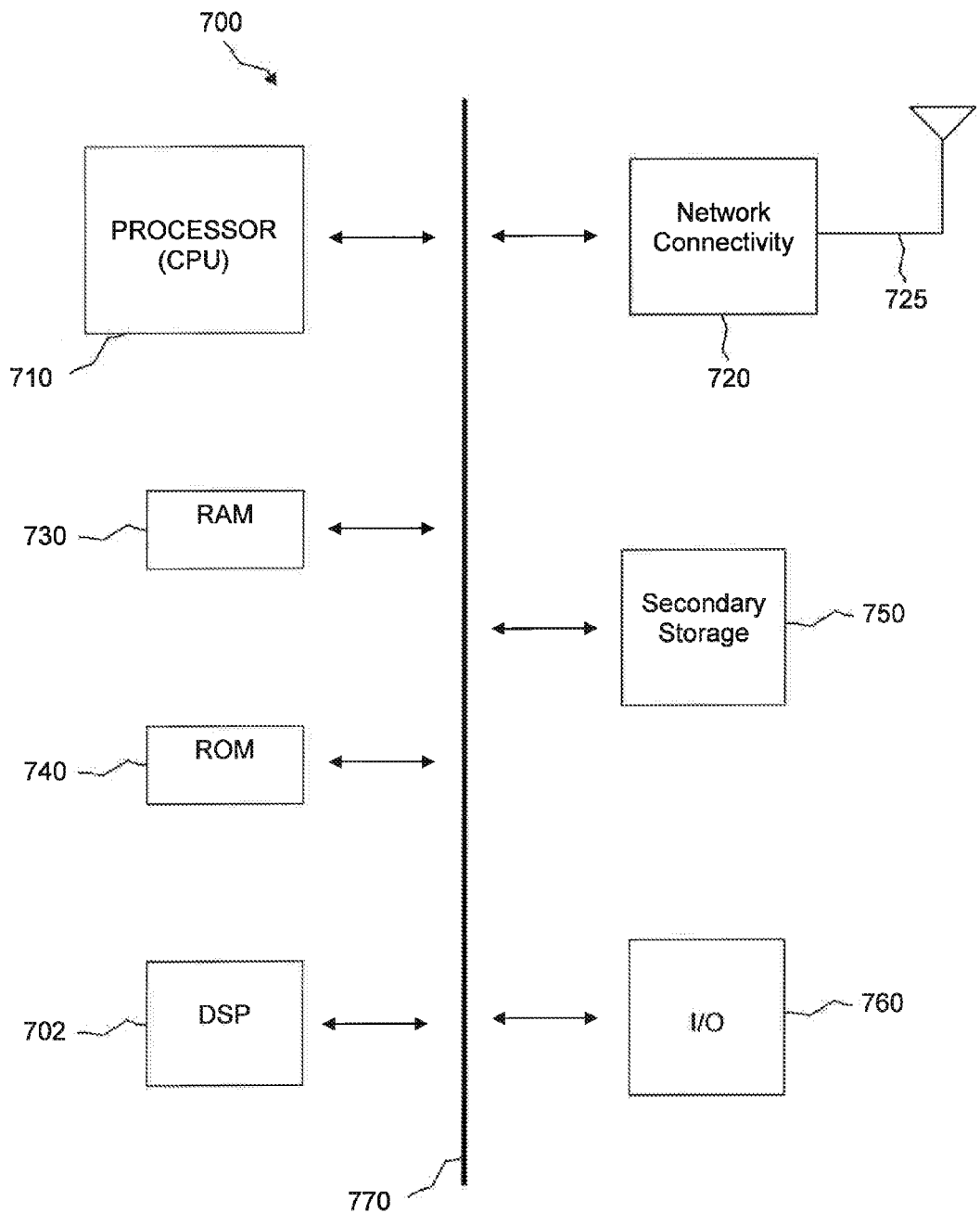
FIG. 7 illustrates a processor and related components suitable for implementing the several embodiments of the present disclosure.

The UE 120 and other components described above might include a processing component that is capable of executing instructions related to the actions described above. FIG. 7 illustrates an example of a system 700 that includes a processing component 710 suitable for implementing one or more embodiments disclosed herein. In addition to the processor 710 (which may be referred to as a central processor unit or CPU), the system 700 might include network connectivity devices 720, random access memory (RAM) 730, read only memory (ROM) 740, secondary storage 750, and input/output (I/O) devices 760. These components might communicate with one another via a bus 770. In some cases, some of these components may not be present or may be combined in various combinations with one another or with other components not shown. These components might be located in a single physical entity or in more than one physical entity. Any actions described herein as being taken by the processor 710 might be taken by the processor 710 alone or by the processor 710 in conjunction with one or more components shown or not shown in the drawing, such as a digital signal processor (DSP) 702. Although the DSP 702 is shown as a separate component, the DSP 702 might be incorporated into the processor 710.

The processor 710 executes instructions, codes, computer programs, or scripts that it might access from the network connectivity devices 720, RAM 730, ROM 740, or secondary storage 750 (which might include various disk-based systems such as hard disk, floppy disk, or optical disk). While only one CPU 710 is shown, multiple processors may be present. Thus, while instructions may be discussed as being executed by a processor, the instructions may be executed simultaneously, serially, or otherwise by one or multiple processors. The processor 710 may be implemented as one or more CPU chips.

The network connectivity devices 720 may take the form of modems, modem banks, Ethernet devices, universal serial bus (USB) interface devices, serial interfaces, token ring devices, fiber distributed data interface (FDDI) devices, wireless local area network (WLAN) devices, radio transceiver devices such as code division multiple access (CDMA) devices, GSM radio transceiver devices, WiMAX devices, and/or other well-known devices for connecting to networks. These network connectivity devices 720 may enable the processor 710 to communicate with the Internet or one or more telecommunications networks or other networks from which the processor 710 might receive information or to which the processor 710 might output information. The network connectivity devices 720 might also include one or more transceiver components 725 capable of transmitting and/or receiving data wirelessly.

The RAM 730 might be used to store volatile data and perhaps to store instructions that are executed by the processor 710. The ROM 740 is a non-volatile memory device that typically has a smaller memory capacity than the memory capacity of the secondary storage 750. ROM 740 might be used to store instructions and perhaps data that are read during execution of the instructions. Access to both RAM 730 and ROM 740 is typically faster than to secondary storage 750. The secondary storage 750 is typically comprised of one or more disk drives or tape drives and might be used for non-volatile storage of data or as an over-flow data storage device if RAM 730 is not large enough to hold all working data. Secondary storage 750 may be used to store programs that are loaded into RAM 730 when such programs are selected for execution.

The I/O devices 760 may include liquid crystal displays (LCDs), touch screen displays, keyboards, keypads, switches, dials, mice, track balls, voice recognizers, card readers, paper tape readers, printers, video monitors, or other well-known input devices. Also, the transceiver 725 might be considered to be a component of the I/O devices 760 instead of or in addition to being a component of the network connectivity devices 720.

Various combinations of the components of the system 700, including memory, hardware, firmware, and/or a combination of software and a processor to run the software may be referred to herein as a "component".

In an embodiment a UE is provided. The UE comprising at least one component configured to decode a TBCC by calculating a plurality of paths that correspond to a plurality of encoder starting states and trace back at least one of the calculated paths per at least one iteration until a TCC condition fails, wherein the TCC condition fails if a starting state of a first traced back path among the calculated paths is not equal to a starting state of a subsequent traced back path.

In another embodiment an access device is provided. The access device comprising at least one component configured to decode a TBCC by calculating a plurality of paths that correspond to a plurality encoder starting states in at least one iteration and trace back at least one of the calculated paths per at least one iteration until a TCC condition fails, wherein the TCC condition fails if a starting state of a first traced back path among the calculated paths is not equal to a starting state of a subsequent traced back path.

In another embodiment, a method implemented on a device is provided. The method comprising receiving-TBCC, calculating a plurality of paths that correspond to a plurality encoder starting states of the TBCC in at least one iteration, and tracing back at least one of the calculated paths per at least one iteration until a TCC condition fails, wherein the TCC condition fails if a starting state of a first traced back path among the calculated paths is not equal to a starting state of a subsequent traced back path.

The method, wherein the device is one of a UE, an access device, or any network connectivity device.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

Also, techniques, systems, subsystems and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A user equipment (UE), comprising:
   at least one component configured to decode a tail-biting convolution code (TBCC) by calculating a plurality of paths that correspond to a plurality of encoder starting states and trace back at least one of the calculated paths per at least one iteration until a trace-back convergence check (TCC) condition fails,
   wherein the TCC condition fails if a starting state of a first traced back path among the calculated paths is not equal to a starting state of a subsequent traced back path.

2. The UE of claim 1, wherein the TBCC is received in a Physical Control Channel (PDCCH).

3. The UE of claim 1, wherein the TCC condition is not used during a first iteration and only a first calculated path is traced-back during the first iteration.

4. The UE of claim 1, wherein the calculated paths are ordered based on their corresponding calculated state metrics before tracing back the calculated paths.

5. The UE of claim 4, wherein the first traced back path has the highest value state metric and the subsequent traced back path has a lower value state metric.

6. The UE of claim 4, wherein the first traced back path has the lowest value state metric and the subsequent traced back path has a higher value state metric.

7. The UE of claim 1, wherein the first traced back path is used to obtain a match to an original bit stream that corresponds to the TBCC before encoding if the first traced back path is a tail-biting path.

8. The UE of claim 1, wherein the subsequent traced back path is used to obtain a match to an original bit stream that corresponds to the TBCC before encoding if the subsequent traced back path is a tail-biting path and the first traced back path is not a trail-biting path.

9. The UE of claim 1, wherein the first traced back path is used to obtain a match to an original bit stream that corresponds to the TBCC before encoding if none of the calculated paths is a tail-biting path.

10. An access device, comprising:
    at least one component configured to decode a tail-biting convolution code (TBCC) by calculating a plurality of paths that correspond to a plurality of encoder starting states in at least one iteration and trace back at least one of the calculated paths per at least one iteration until a trace-back convergence check (TCC) condition fails,
    wherein the TCC condition fails if a starting state of a first traced back path among the calculated paths is not equal to a starting state of a subsequent traced back path.

11. The access device of claim 10, wherein the TCC condition is not used during a first iteration and only a first calculated path is traced-back during the first iteration.

12. The access device of claim 10, wherein the calculated paths are ordered based on their corresponding calculated state metrics before tracing back the calculated paths.

13. The access device of claim 12, wherein the first traced back path has the highest value state metric and the subsequent traced back path has a lower value state metric.

14. The access device of claim 12, wherein the first traced back path has the lowest value state metric and the subsequent traced back path has a higher value state metric.

15. The access device of claim 10, wherein the first traced back path is used to obtain a match to an original bit stream that corresponds to the TBCC before encoding if the first traced back path is a tail-biting path.

16. The access device of claim 10, wherein the subsequent traced back path is used to obtain a match to an original bit stream that corresponds to the TBCC before encoding if the subsequent traced back path is a tail-biting path and the first trail-biting path is not a trail-biting path.

17. The access device of claim 10, wherein the first traced back path is used to obtain a match to an original bit stream that corresponds to the TBCC before encoding if none of the calculated paths is a tail-biting path.

18. A method implemented on a device, comprising;
    receiving a tail-biting convolution code (TBCC);
    calculating a plurality of paths that correspond to a plurality encoder starting states of the TBCC in at least one iteration; and
    tracing back at least one of the calculated paths per at least one iteration until a trace-back convergence check (TCC) condition fails,
    wherein the TCC condition fails if a starting state of a first traced back path among the calculated paths is not equal to a starting state of a subsequent traced back path.

19. The method of claim 18 further comprising:
    sorting the computed paths based on their corresponding calculated state metrics;
    tracing back at least one of the computed paths in the sorted order until a trail-biting path is found, a TCC condition fails, or all the computed paths are traced back; and
    using the tail-biting path or the first traced back path if the tail-biting path is not found to obtain a match to an original bit stream that corresponds to the TBCC before encoding.

20. The method of claim 19, wherein the first traced back path has a highest value state metric and the subsequent traced back path has a lower value state metric.

21. The method of claim 19, wherein the first traced back path has a lowest value state metric and the subsequent traced back path has a higher value state metric.

22. The method of claim 18, wherein the TBCC is received in a Physical Control Channel (PDCCH).

23. The method of claim 18, wherein the TCC condition is not used during a first iteration and all the computed paths are traced-back during the first iteration.

24. The method of claim 18, wherein the device is one of a user equipment (UE), an access device, or any network connectivity device.

* * * * *